United States Patent [19]

Walls et al.

[11] 4,414,311

[45] Nov. 8, 1983

[54] CATHODIC DEPOSITION OF LIGHT SENSITIVE COMPONENTS

[75] Inventors: John E. Walls, Annandale; Thomas A. Dunder, High Bridge, both of N.J.

[73] Assignee: American Hoechst Corporation, Somerville, N.J.

[21] Appl. No.: 359,458

[22] Filed: Mar. 18, 1982

[51] Int. Cl.³ .................. G03C 1/54; G03C 1/94
[52] U.S. Cl. ........................ 430/157; 204/2; 204/6; 204/17; 204/33; 204/38 A; 204/38 R; 204/40; 204/42; 204/58; 430/155; 430/159; 430/168; 430/169; 430/175; 430/275; 430/278
[58] Field of Search ............... 430/168, 169, 157, 159, 430/278, 163, 155, 175, 275; 204/2, 6, 17, 33, 38 A, 38 R, 40, 42, 58

[56] References Cited

U.S. PATENT DOCUMENTS

| | | |
|---|---|---|
| 2,126,017 | 8/1938 | Jenny et al. . |
| 2,612,469 | 9/1952 | Reisinger ..................... 204/52 Y |
| 3,073,765 | 1/1963 | Adams . |
| 3,295,977 | 3/1966 | Deziel . |
| 3,307,951 | 3/1967 | Adams et al. . |
| 3,481,798 | 12/1969 | Raether . |
| 3,511,661 | 5/1970 | Rauner et al. . |
| 3,594,289 | 7/1971 | Watkinson et al. . |
| 3,600,173 | 8/1971 | Levinos ........................ 430/52 |
| 3,755,093 | 8/1973 | Suematsu ...................... 204/58 |
| 3,756,826 | 9/1973 | Zalley ........................... 430/278 |
| 3,891,516 | 6/1975 | Chu . |
| 3,929,591 | 12/1975 | Chu et al. . |
| 3,933,499 | 1/1976 | Traskos . |
| 3,935,080 | 1/1976 | Gumbinner et al. . |
| 3,953,212 | 4/1976 | Miyano et al. . |
| 3,958,994 | 5/1976 | Burnett . |
| 4,022,670 | 5/1977 | Dean ............................. 204/58 |
| 4,049,504 | 9/1977 | Chu et al. ..................... 204/58 |
| 4,137,096 | 1/1979 | Maier . |
| 4,152,158 | 5/1979 | Chu . |
| 4,153,461 | 5/1979 | Berghauser et al. . |
| 4,166,777 | 9/1979 | Casson et al. ................. 204/58 |
| 4,277,555 | 7/1981 | Fromson et al. .............. 430/278 |

*Primary Examiner*—Charles L. Bowers, Jr.
*Attorney, Agent, or Firm*—Richard S. Roberts

[57] ABSTRACT

Light sensitive compounds are deposited onto a hydrophilized metal substrate, which is preferably aluminum, by means of a direct current electromotive force. The light sensitive component is dissolved in a current carrying solvent. Cathodic, hydrophilized, aluminum is passed through the solution and the EMF applied. The result is a light sensitive coating on the hydrophilized substrate surface.

11 Claims, No Drawings

CATHODIC DEPOSITION OF LIGHT SENSITIVE COMPONENTS

BACKGROUND OF THE INVENTION

The present invention relates to light sensitive elements or more particularly to photosensitive elements suitable for use as lithographic printing plates or photoresists.

In the production of lithographic printing plates, a hydrophilized metal sheet substrate, usually aluminum is with a photosensitive composition. This photosensitive composition is exposed to ultraviolet radiation through a photomask and developed with a suitable developer composition. The resultant plate can then be employed on a printing press to produce thousands of image reproductions.

Heretofore, the photosensitive component has been applied to the substrate by a mechanical coating means. That is, the coating has been either manually wiped on to the substrate, whirler coated, brushed or sprayed on the surface. The most common application means include gravure coating; dipping an aluminum web through a bath of the photosensitive material and doctoring off the excess; and meniscus coating methods which are well known to the skilled artisan.

The present application improves upon these coating methods by electrodepositing the photosensitive component onto the hydrophilized substrate surface. The result is a photographic element having improved adhesion between the photosensitive composition and the hydrophilized substrate surface. When the thusly produced plate is exposed and developed, the image formed is observed to exhibit relatively high resolution and intensity. It displays exceptional light speed and excellent uniform adhesion and abrasion resistance.

SUMMARY OF THE INVENTION

The present invention provides a photographic element produced by the method which comprises
(a) electrochemically hydrophilizing a metal substrate surface; and
(b) subsequently electrolyzing said substrate in an aqueous electrolytic solution which comprises a light sensitive substantial water soluble diazo compound and an optional compatible solvent composition capable of sustaining current flow under electrolytic conditions sufficient to bond said light sensitive composition to said hydrophilized surface.

One method of electrolytically hydrophilizing the metal substrate is electrolyzing the metal substrate as an anode using direct or positive pulsed current in an aqueous electrolyte containing at least one water soluble organic acid under electrolyzing conditions sufficient to form a metal-organic complex bonded to the surface of said substrate. The electrolyte may optionally also contain an inorganic acid.

Another hydrophilizing method pertains to electrochemically forming a ceramic surface on the substrate as will be hereinafter discussed.

DETAILED DESCRIPTION OF THE PREFERRED EMBODIMENT

In the production of the photographic elements of the present invention, a light sensitive composition is electrodeposited onto a suitable hydrophilized lithographic substrate. Substrates employable within this context must be electrically conductive and may be such metals as aluminum, steel or zinc, but aluminum and its alloys such as lithographic grades 1100 and 3003 are most preferred.

The light sensitive component, which comprises a substantially water soluble diazo compound, such as one or more diazonium salts, is dissolved in water, preferably deionized water. Additional compatible solvents may also be added if desired by the skilled artisan. The substrate is made a cathode and is immersed into or submersed in an electrolyzing bath of the aqueous and or solvent composition and light sensitive component while an EMF is applied via another electrode in the bath. A very thin, well bonded layer of the photosensitive composition is thereby deposited onto the substrate. The thusly produced element is then water washed and dried.

Non-limiting photosensitive compositions which may be used within the context of the present invention include water soluble diazo compounds, particularly water soluble negative working diazonium salts. Preferred photosensitive compositions are:

The product of precondensation with phosphoric acid beginning with 4,4'-Bis-methoxy methyl diphenyl ether is then condensed with 3-methoxy-4-diazo diphenyl amine sulfate in phosphoric acid and isolated as the phosphate salt.

The product of the condensation reaction between 4-diazo diphenyl amine sulfate and 4,4'-Bis-methoxy methyl diphenyl sulfide in phosphoric acid isolated as the phosphate and subsequently condensed with 2,5-dibutoxy-4-diazo tolyl mercapto benzene chloride and paraformaldehyde in sulfuric acid and isolated as the sulfate.

4-diazo diphenyl amine sulfate condensed with 4,4'-Bis methoxy methyl diphenyl ether in phosphoric acid, isolated as the phosphate.

3-methoxy-4-diazo diphenyl amine sulfate condensed with 4,4'-Bis-hydroxy methyl diphenyl sulfide in phosphoric acids, isolated as the phosphate salt.

2,5-dibutoxy-4-diazo tolyl mercapto benzene chloride and 4-diazo diphenyl amine sulfate condensed with paraformaldehyde in sulfuric acid and isolated as the sulfate salt.

The photosensitive composition may be present in the aqueous electrolytic solution in an amount of from about 1 to about 150 g/l, preferably from about 5 to about 100 g/l and more preferably from about 10 to about 30 g/l. The electrolyzing solution may optionally contain minor amounts of other solvents so long as their presence does not detrimentally affect the electrodeposition mechanism.

In the preferred embodiment, the EMF employed is direct current. The selection of the polarity of the substrate depends upon the electrical response characteristics of the photosensitive composition. For example, diazo compounds are generally cationic. Therefore to attract the diazo to the substrate, the substrate must be made the cathode. Again, the selection of polarity may be routinely determined by the skilled artisan.

The applied voltage normally sufficient for driving the diazo to the aluminum surface ranges from about 1 to about 30 volts, preferably from about 10 to about 30 volts.

The voltage is preferably apply for up to about 60 seconds, or more preferably for from about 5 to about 30 seconds or most preferably from about 20 to about 30 seconds.

The electrolyte is preferably maintained at a temperature under about 40° C., preferably from about 5° to about 30° C. and more preferably from about 10° to about 20° C.

The cathode to anode distance on each side of the aluminum web is preferably from about 1 to about 10 cm., more preferably from about 2 to about 7 cm. and most preferably from about 2.5 to about 5 cm.

The current density applied to each side of the aluminum electrodeposited ranges from about 1.4 to about 15.0 amperes/dm$^2$, more preferably from about 2 to about 15 A/dm$^2$ and most preferably from about 6 to about 15 A/dm$^2$.

The coating weight of light sensitive compound on the aluminum preferably ranges from about 20 to about 600 mg/m$^2$, more preferably from about 100 to about 400 mg/m$^2$ and most preferably from about 200 to about 240 mg/m$^2$.

When selecting a diazo compound for its suitability for use in the present invention, certain criteria should be met. The compound must be substantially water soluble and preferably should be at least approximately 99% water soluble. Preferably used is deionized water which should have a conductivity of at least 1 megohms. A solution of ten grams of a diazo useful for the present invention which is dissolved in a liter of deionized water, after filtration and drying should leave a residue of $\leq 0.1$ gram.

TEST PROCEDURE

In addition, the following Test Procedure is useful. A four centimeter square sample of lithographic grade aluminum having an electrodeposition hydrophilizing surface, as hereinafter described, is placed in a solution comprising a 1% by weight solution of the test diazo in deionized water, between two lead electrodes. The lead electrodes are made anodes and the aluminum sample a cathode. A current density of 1.4 amperes per square decimeter is applied to each side of the aluminum. If a tar-like deposit or precipitate is formed at the electrodes, or nitrogen gas generation is noticed in the solution, the diazo compound is not suitable.

In the practice of the present invention, it is most highly preferred that prior to the deposition of the light sensitive material that the metal base substrate be rendered hydrophilic, preferably by the electrodeposition of a hydrophilizing agent. Most preferred methods of electrodepositing hydrophilizing agents are described in copending U.S. patent application Ser. No. 188,091 and 188,092, both filed on Sept. 26, 1980. Another preferred method of surface hydrophilizing is by depositing a ceramic surface on the substrate. A more complete description of this ceramic surface is described in U.S. patent application Ser. No. 359,455, filed on even date herewith, now U.S. Pat. No. 4,376,814. These applications are incorporated herein by reference.

A first method for electrodeposition such a hydrophilizing agent comprises cleaning the metal substrate, and then electrolyzing the metal substrate made anodic using direct current in an aqueous electrolytic solution having dissolved therein an electrolyte comprising:

a water-soluble organic acid or mixture of two or more water-soluble organic acids which, if carboxylic, be at least tribasic, under electrolytic conditions sufficient to form an insoluble metal oxide-organic complex, bonded to the surface of said metal article.

Preferred water-soluble organic acids, are selected from the group consisting of the condensation product of benzene phosphonic acid and formaldehyde, phytic acid, polyvinyl phosphonic acid, 2-ethyl polyphosphoric acid, and mixtures of these.

In a second process for electrodepositing the hydrophilizing agent, the first method, above, is used except an additional ingredient is present in the electrolyte. This extra ingredient is a strong inorganic acid comprising a phosphorus oxo acid having POH groups in which the hydrogen atom is ionizable. Preferred inorganic acids include phosphoric acid and phosphorous acid.

A third process for electrodepositing the hydrophilizing agent comprises electrolyzing the substrate in an electrolyte by (a) admixing a compound selected from the group consisting of silicates, tetraborates and pentaborates having monovalent cations, with (b) the product obtained by titrating an aqueous solution of one or more compounds selected from the group consisting of organic sulfonic, phosphonic, phosphoric and tribasic or higher functionality carboxylic acids with a monovalent alkali until an alkaline pH is attained provided and titration product is selected such that it does not form a precipitate with the compound of part (a).

Preferred acids include polyvinyl phosphonic acid, phytic acid, polyvinyl sulfonic acid, polyvinyl methyl ether maleic anhydride copolymer and 2-ethyl hexyl polyphosphoric acid. Preferred alkalis include sodium, lithium, potassium and ammonium hydroxide. Preferred silicates include sodium, potassium and lithium silicate. Preferred borates include ammonium pentaborate and potassium tetroborates.

The following non-limiting examples serve to illustrate the invention.

EXAMPLE #1

An aqueous solution is prepared by dissolving 6.0 grams of the product, resulting from the reaction between 4-diazo diphenyl amine sulfate and paraformaldehyde in phosphoric acid, and isolated at the phosphate salt, into 594 grams of deionized water. This solution, is maintained in a beaker, which has immersed into it two lead electrodes separated by a distance of 10.0 cm. Inserted equidistant between the two electrodes is a section of aluminum having been hydrophilized by electrodepositing polyvinyl phosphonic acid. A circuit is formed where the aluminum is made the cathode and the two lead electrodes are made anodes. A potential of 30 VDC is applied and the current consumed is measured to be 110 coulombs/dm$^2$. The treated plate is removed and well rinsed with water, after which it is blotted dry. The surface is then exposed to UV radiation through a negative image test flat with energy measured at 170 millijoules/cm$^2$. The exposed plate is then developer with a subtractive developer that is described in U.S. Pat. No. 4,308,340 and subsequently inked to observe the image. Using a 21-step Stauffer Guide, a solid step 8 is to be observed with 5 ghost steps. The background is clean and free of ink and the image has a high resolution and a relationship to the test flat used for exposure corresponding to 1:1.

The opposite side is processed in like manner and one finds it to be identical in all respects. An additional sample has the coating removed to determine the coating weight. One finds it to be a layer of 96 mg/M$^2$.

A larger plate (15 cm $\times$ 55 cm) is similarly prepared for evaluation on a sheet-fed printing press. 70,000 quality copies are obtained before the image is considered to be unacceptable.

EXAMPLE #2

The same solution, as described in Example #1, is used to prepare a coated plate on an aluminum surface having likewise been hydrophilized as described therein. In this instance, the aluminum is immersed for 60 seconds in the light sensitive composition without any electrical potential being applied. The plate is removed, rinsed and blotted dry. The coating on each side is approximately 27 mg/m$^2$ and when exposed to 170 mj/cm$^2$ of UV radiation, developed and inked, is found to have a gray scale reading of a solid 4 with 2 ghost steps.

A large plate (15 cm×55 cm) is likewise coated. The exposure is increased as to result in a solid step 7 on the gray scale. The plate is then run on a sheet-fed printing press to provide a control, and is able to provide only 6000 acceptable copies before being considered of poor quality.

EXAMPLE #3

A plate is prepared for press evaluation in like manner as detailed in Example #1 except that instead of development being subtractive, a lacquer developer is used. The lacquer developer is Western Jet Black, manufactured by Western Litho. On a sheet-fed press, 185,000 quality impressions are produced. For comparison, the plate described in Example #2 is similarly lacquer developed and evaluated on the press where one observes the production of only 37,000 acceptable copies.

EXAMPLES 4 THROUGH 15

The following tabulates the results to be noticed using the indicated process conditions with several diazonium compounds. The key for these compounds is as follows:

D-1 4-diazo diphenyl amine sulfate condensed with 4,4'-Bis methoxy methyl diphenyl ether in phosphoric acid, isolated as the phosphate salt.

D-2 3-methoxy-4-diazo diphenyl amine sulfate condensed with 4,4'-Bis hydroxy methyl diphenyl sulfide in phosphoric acids, isolated as the phosphate salt.

D-3 2,5-dibutoxy-4-diazo tolyl mercapto benzene chloride and 4-diazo diphenyl amine sulfate condensed with paraformaldehyde in sulfuric acid and isolated as the sulfate salt.

D-4 The product of precondensation with phosphoric acid of 4,4'-Bis methoxy methyl diphenyl ether condensed with 3-methoxy-4-diazo diphenyl amine sulfate in phosphoric acid and isolated as the phosphate salt.

D-5 The product of the condensation reaction between 4-diazo diphenyl amine sulfate and 4,4'-Bis methoxy methyl diphenyl sulfide in phosphoric acid isolated as the phosphate and subsequently condensed with 2,5-dibutoxy-4-diazo tolyl mercapto benzene chloride and paraformaldehyde in sulfuric acid and isolated as the sulfate.

Examples 2, 4, 9, 11 and 13 are illustrative techniques wherein the coating is applied without any electrical assistance. The balance of the examples reflect the improvement offered by the present invention. Example 1 shows the use of direct current to apply a diazo coating. The most pronounced difference, when contrasted to Example 2 which uses a prior method, is the order of magnitude increase in press performance. This same improvement is likewise shown when comparing Examples 4 and 9 to 5 and 10, respectively. Whereas the aforementioned plates were processed substractively, additive or lacquer developed plates also display a significant difference in press performance. The plate of Example #1 when processed with lacquer and contrasted to the plate of Example #2, likewise treated, results in a five-fold increase. This is similarly true for Examples 12 and 13 where a different diazo is used both conventionally and electrically and which also has an improvement by a factor of five.

Length of run is not the only benefit derived from the present invention. As can be seen when comparing Examples 4, 9, 11 and 13 with Examples 5, 10, 12 and 14, respectively, there is a dramatic decrease in the amount of energy required to obtain the same solid step on the plates illustrative of this invention.

| Example No. | Diazo Used | Conc. % w/n | Processing Conditions | Exposure (mj/cm$^2$) | Stepsedge Solid/Ghost | Coating WT mg/m$^2$ | Length of Run | Developer |
|---|---|---|---|---|---|---|---|---|
| 4 | D-1 | 1.0 | Immersed at R.T. for 60 secs, Rinsed and Blotted Dry | 85 | 6/5 | 30 | 7,000 | Subtractive Developer & Ink |
| 5 | D-1 | 1.0 | 10 VDC at R.T. consumed 42 coulombs/dm$^2$ rinsed & blotted dry | 34 | 6/6 | 105 | 65,000 | Subtractive Developer & Ink |
| 6 | D-2 | 0.5 | 10 VDC at R.T. consumed 31 coulombs/dm$^2$ rinsed & blotted dry | 18 | 6/5 | 88 | not run | Lacquer Developer |
| 7 | D-2 | 1.0 | 10 VDC at R.T. consumed 43 coul/dm$^2$ rinsed & blotted dry | 20 | 6/7 | 97 | not run | Lacquer Developer |
| 8 | D-2 | 2.5 | 10 VDC at R.T. consumed 58 coulombs/dm$^2$ | 26 | 6/8 | 140 | not run | Lacquer Developer |
| 9 | D-3 | 1.0 | Immersed at R.T. for 60 secs, rinsed and blotted dry | 144 | 6/2 | 26 | 7,000 | Subtractive Developer & Ink |
| 10 | D-3 | 1.0 | 30 VDC at R.T. consumed 121 coulombs/dm$^2$ rinsed blotted dry | 27 | 6/4 | 93 | 75,000 | Subtractive Developer & Ink |
| 11 | D-3 | 1.0 | Immersed at R.T. for 60 secs, rinsed and blotted dry | 136 | 6/3 | 28 | 43,000 | Lacquer Developer |
| 12 | D-3 | 1.0 | 30 VDC at R.T. consumed 121 coulombs/dm$^2$ rinsed | 24 | 6/4 | 90 | 205,000 | Lacquer Developer |

-continued

| Example No. | Diazo Used | Conc. % w/n | Processing Conditions | Exposure (mj/cm$^2$) | Stepsedge Solid/Ghost | Coating WT mg/m$^2$ | Length of Run | Developer |
| --- | --- | --- | --- | --- | --- | --- | --- | --- |
| 13 | D-4 | 1.0 | Immersed at R.T. for 60 secs, rinsed and blotted dry | 14 | 6/5 | 31 | not run | Lacquer Developer |
| 14 | D-4 | 1.0 | 30 VDC at R.T. consumed 78 coulombs/dm$^2$ rinsed and blotted dry | 9 | 6/6 | 78 | not run | Lacquer Developer |
| 15 | D-5 | 1.0 | 30 VDC at R.T. consumed 138 coulombs/dm$^2$ rinsed and blotted dry | 10 | 6/4 | 93 | 75,000 | Subtractive Developer & Ink |

*Energy necessary to obtain a solid gray scaled step 6 after developing and inking.

What is claimed is:

1. A photographic element produced by the method which comprises
   (i) electrochemically hydrophilizing an electrically conductive metal substrate surface; and
   (ii) subsequently electrolyzing said substrate, which functions as an electrode, in an aqueous electrolytic solution which comprises a suitable light sensitive, substantially water soluble diazo salt as determined by the herein specified Test Procedure, under electrolytic conditions, with an EMF applied via another electrode in the bath, sufficient to bond said light sensitive composition to said hydrophilized surface.

2. The element of claim 1 wherein said substrate comprises aluminum or its alloys.

3. The element of claim 2 wherein said hydrophilizing is conducted by electrolyzing the metal substrate made anodic using direct current in an aqueous electrolytic solution having dissolved therein an electrolyte comprising:
   a water-soluble organic acid or mixture of one or more water-soluble organic acids which, if carboxylic, is at least tribasic, under electrolytic conditions sufficient to form an insoluble metal oxide-organic complex, bonded to the surface of said metal article.

4. The element of claim 3 wherein said water-soluble organic acid is selected from the group consisting of the condensation product of benzene phosphonic acid and formaldehyde, phytic acid, polyvinyl phosphoric acid, 2-ethyl polyphosphoric acid, and mixtures of these.

5. The element of claim 3 wherein said hydrophilizing electrolyte further comprises one or more strong inorganic acids comprising a phosphorus oxo acid having POH groups in which the hydrogen atom is ionizable.

6. The element of claim 5 wherein said inorganic acid is phosphoric acid or phosphorous acid.

7. The element of claim 1 wherein said hydrophilizing is conducted by electrolyzing the substrate in an electrolyte produced by:
   (a) admixing a compound selected from the group consisting of silicates, tetraborates and pentaborates having monovalent cations, with
   (b) the product obtained by titrating an aqueous solution of one or more compounds selected from the group consisting of organic sulfonic, phosphonic, phosphoric and tribasic or higher functionality carboxylic acids with a monovalent alkali until an alkaline pH is attained provided said tritration product is elected such that it does not form a precipitate with the compound of part (a).

8. The element of claim 7 wherein said acid in step (b) comprises one or more acids selected from the group consisting of polyvinyl sulfonic acid, polyvinyl methyl ether maleic anhydride copolymer and 2-ethyl hexyl polyphosphoric acid.

9. The element of claim 7 wherein said alkali comprises one or more compounds selected from the group consisting of sodium, lithium, potassium and ammonium hydroxide.

10. The element of claim 7 wherein said compound of step (a) comprises one or more compounds selected from the group consisting of sodium, potassium and lithium silicate, ammonium pentaborate and potassium tetraborate.

11. The element of claim 1 wherein said diazo salt is a diazonium salt.

* * * * *